United States Patent
Fu et al.

(10) Patent No.: US 7,805,258 B2
(45) Date of Patent: Sep. 28, 2010

(54) SYSTEM AND METHOD FOR FILM STRESS AND CURVATURE GRADIENT MAPPING FOR SCREENING PROBLEMATIC WAFERS

(75) Inventors: Hsueh-Hung Fu, Hsin-Chu (TW); Chih-Wei Chang, Hsin-Chu (TW); Shih-Chang Chen, Hsin-Chu (TW); Chin-Piao Chang, Taipei (TW); Shing-Chyang Pan, Hsinchu (TW); Wei-Jung Lin, Taipei (TW); Tsung-Hsun Huang, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 511 days.

(21) Appl. No.: 11/707,662

(22) Filed: Feb. 16, 2007

(65) Prior Publication Data
US 2008/0199978 A1 Aug. 21, 2008

(51) Int. Cl.
*G06F 19/00* (2006.01)
*G06F 17/40* (2006.01)

(52) U.S. Cl. ............ 702/35; 73/760; 356/237.1; 356/237.2; 356/237.5; 382/145; 382/149; 438/14; 702/81; 702/167

(58) Field of Classification Search .......... 73/104, 73/760, 786, 787, 865.8; 356/2, 237.1, 237.2, 356/237.3, 237.4, 237.5, 600, 601; 382/100, 382/108, 141, 144, 145, 146, 147, 149, 150; 438/14, 16, 17; 702/1, 33, 35, 40, 81, 82, 702/83, 84, 127, 187, 189

See application file for complete search history.

(56) References Cited

U.S. PATENT DOCUMENTS

| | | | | |
|---|---|---|---|---|
| 5,307,680 A | * | 5/1994 | Drescher-Krasicka | 73/606 |
| 5,549,003 A | * | 8/1996 | Drescher-Krasicka | 73/606 |
| 5,976,993 A | * | 11/1999 | Ravi et al. | 438/788 |
| 7,294,205 B1 | * | 11/2007 | Ravi et al. | 118/695 |
| 2008/0195983 A1 | * | 8/2008 | Chidambarrao et al. | 716/2 |

FOREIGN PATENT DOCUMENTS

| | | |
|---|---|---|
| CN | 1511247 A | 7/2004 |
| WO | WO 02/099373 A2 | 12/2002 |

OTHER PUBLICATIONS

Chen, T., et al., "The Research Progress of Thin Film Stress," Vacuum & Cryogenics, Jun. 2006, pp. 68-74.

\* cited by examiner

*Primary Examiner*—Edward R Cosimano
(74) *Attorney, Agent, or Firm*—Slater & Matsil, L.L.P.

(57) ABSTRACT

A method of testing a wafer after a current top layer is formed over the wafer. Stress data is collected for the wafer after forming the current top layer. The stress data is derived from changes in wafer curvature. The stress data includes: stress-xx in an x direction and stress-yy in a y direction for each area of a set of finite areas on the wafer, the stress-xx and stress-yy both being derived from wafer-curvature-change-xx in the x direction for each area of the set of finite areas and from wafer-curvature-change-yy in the y direction for each area of the set of finite areas; and the stress-xy being derived from wafer-curvature-change-xy, wherein wafer-curvature-change-xy is a change in wafer twist in the x-y plane for each area of the set of finite areas. A stress gradient vector (and/or its norm) is calculated and used to evaluate the investigating single or multiple accumulated layer.

18 Claims, 8 Drawing Sheets

SYSTEM AND METHOD FOR FILM STRESS AND CURVATURE GRADIENT MAPPING FOR SCREENING PROBLEMATIC WAFERS

TECHNICAL FIELD

The present invention generally relates to semiconductor manufacturing. In one aspect it relates more particularly to testing and screening problematic wafers during semiconductor manufacturing.

BACKGROUND

During semiconductor manufacturing, partially manufactured and completed integrated circuit chips are tested before being cut from the wafer. Currently, most tests are electrical tests to determine if a device or group of devices on a chip works properly. But in making each device, there are numerous steps and processes involved. Electrical device tests are not able to pinpoint which process or step in the manufacturing is problematic. And, most electrical tests can only be performed after numerous processes. Hence, there is a need for a way to test certain steps and processes directly after the step or process. This would allow problematic wafers to be identified before proceeding with the time and expense of further steps and processes on that wafer.

SUMMARY OF THE INVENTION

The problems and needs outlined above may be addressed by embodiments of the present invention. In accordance with one aspect of the present invention, a method of testing a wafer during semiconductor manufacturing is provided. This method includes the following steps described in this paragraph. The order of the steps may vary, may be sequential, may overlap, may be in parallel, and combinations thereof, if not otherwise stated. A current top layer is formed over device structures for integrated circuit chips being formed on the wafer. Stress data is collected for the wafer after the forming of the current top layer. The stress data is derived from changes in wafer curvature. The stress data includes: stress-xx in an x direction and stress-yy in a y direction for each area of a set of finite areas on the wafer, the stress-xx and stress-yy both being derived from wafer-curvature-change-xx in the x direction for each area of the set of finite areas and from wafer-curvature-change-yy in the y direction for each area of the set of finite areas, wherein an x-y plane is along a top surface of the wafer and wherein the x direction is orthogonal to the y direction; and stress-xy being a shear stress in the x-y plane for each area of the set of finite areas, the stress-xy being derived from wafer-curvature-change-xy, wherein wafer-curvature-change-xy is a change in wafer twist in the x-y plane for each area of the set of finite areas. A stress gradient vector is calculated for each area of the set of finite areas. A norm for each stress gradient vector is calculated for each area of the set of finite areas. The finite areas having its stress gradient vector norm greater than a predetermined high-stress-gradient-vector-norm threshold are identified.

In accordance with another aspect of the present invention, a method of testing a wafer is provided. This method includes the following steps described in this paragraph. The order of the steps may vary, may be sequential, may overlap, may be in parallel, and combinations thereof, if not otherwise stated. A current top layer is formed over the wafer. Stress data is collected for the wafer after the forming of the current top layer. The stress data is derived from changes in wafer curvature. The stress data includes: stress-xx in an x direction and stress-yy in a y direction for each area of a set of finite areas on the wafer, the stress-xx and stress-yy both being derived from wafer-curvature-change-xx in the x direction for each area of the set of finite areas and from wafer-curvature-change-yy in the y direction for each area of the set of finite areas, wherein an x-y plane is along a top surface of the wafer and wherein the x direction is orthogonal to the y direction; and stress-xy being a shear stress in the x-y plane for each area of the set of finite areas, the stress-xy being derived from wafer-curvature-change-xy, wherein wafer-curvature-change-xy is a change in wafer twist in the x-y plane for each area of the set of finite areas. A stress gradient vector is calculated for each area of the set of finite areas. The forming of the current top layer is evaluated based on the stress gradient vectors.

In accordance with another aspect of the present invention, a method of troubleshooting to find a cause of defects in semiconductor manufacturing is provided. This method includes the following steps described in this paragraph. The order of the steps may vary, may be sequential, may overlap, may be in parallel, and combinations thereof, if not otherwise stated. A wafer is tested after various suspected defect-causing steps in a semiconductor manufacturing process, each testing includes: (i) collecting stress data for the wafer after the forming of a current layer being tested, the stress data being derived from changes in wafer curvature, and the stress data includes: (A) stress-xx in an x direction and stress-yy in a y direction for each area of a set of finite areas on the wafer, the stress-xx and stress-yy both being derived from wafer-curvature-change-xx in the x direction for each area of the set of finite areas and from wafer-curvature-change-yy in the y direction for each area of the set of finite areas, wherein an x-y plane is along a top surface of the wafer and wherein the x direction is orthogonal to the y direction, and (B) stress-xy being a shear stress in the x-y plane for each area of the set of finite areas, the stress-xy being derived from wafer-curvature-change-xy, wherein wafer-curvature-change-xy is a change in wafer twist in the x-y plane for each area of the set of finite areas; (ii) calculating a stress gradient vector for each area of the set of finite areas; (iii) calculating a norm for each stress gradient vector for each area of the set of finite areas; and (iv) identifying the finite areas having its stress gradient vector norm greater than a predetermined high-stress-gradient-vector-norm threshold. After this testing of various samples at various stages of manufacturing, it may be determined which of the suspected defect-causing steps is causing stress gradient vector norms for the wafer to be higher than the predetermined high-stress-gradient-vector-norm threshold for a given layer. This may correlate to the defects being caused in the finished devices.

The foregoing has outlined rather broadly features of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The following is a brief description of the drawings, which illustrate exemplary embodiments of the present invention and in which.

DETAILED DESCRIPTION OF ILLUSTRATIVE EMBODIMENTS

Referring now to the drawings, wherein like reference numbers are used herein to designate like or similar elements throughout the various views, illustrative embodiments of the present invention are shown and described. The figures are not necessarily drawn to scale, and in some instances the drawings have been exaggerated and/or simplified in places for illustrative purposes only. One of ordinary skill in the art will appreciate the many possible applications and variations of the present invention based on the following illustrative embodiments of the present invention.

Generally, an embodiment of the present invention provides a method of testing a wafer after forming a layer on the wafer. As mentioned above, partially manufactured and completed integrated circuit chips are tested before being cut from the wafer during semiconductor manufacturing. Currently, most tests are electrical tests to determine if a device or group of devices on a chip works properly. But in making each device, there are numerous steps and processes involved. For example, a process of forming a set of transistors for a memory cell or logic device will require numerous layers to be formed, numerous etching steps, and perhaps one or more chemical mechanical polishing (CMP) steps. Any one of these steps may be problematic and causing defective chips on the wafer. Electrical device tests are not able to pinpoint which process or step in the manufacturing is problematic. And, most electrical tests can only be performed after numerous processes.

It would be highly desirable to test the wafer after forming a certain layer and determining whether the layer was formed properly before proceeding with other steps. This is especially true for a certain layer formation process that is much less consistent than other processes. Identifying a defective layer before proceeding with other processes down the line would save production time and manufacturing costs that would be otherwise wasted if further processing were continued on a faulty layer that will most likely cause device failures or performance below specifications. A screening embodiment of the present invention provides a way to test a wafer after forming a layer to determine whether the layer does not meet manufacturing specifications. Such determinations may be provided directly after or shortly after a step or process is performed, for example, which may provide a further determination as to whether processing should continue for that wafer. This would allow problematic wafers to be identified before proceeding with the time and expense of further steps and processes on that wafer.

Also, a testing and experimentation embodiment of the present invention provides a way to test a wafer after forming a layer during research and development to determine whether a certain process will provide desirable results. During such testing and experimentation, threshold levels may be identified for setting specifications on manufacturing and for screening potentially defective wafers during manufacturing. Next, an illustrative method embodiment of the present invention will be described and some of its illustrative applications will be discussed as well.

Machines and tools are available for measuring changes in wafer curvature, such as a wafer curvature metrology tool. One such example is model number CGS300. Such tools may be used to measure a change in curvature at finite element area across a wafer from one processing step to another processing step, for example. This change in curvature data may be used to calculate film stresses on the wafer or in the currently top layer using modified Stoney's equations. In particular, the change in curvature data may be used to calculate stress in the x direction ($\sigma_{xx}$), stress in the y direction ($\sigma_{yy}$) and shear stress in the x-y plane ($\sigma_{xy}$), where the x-y plane is along a top surface of the wafer and where the x direction is orthogonal to the y direction. The modified Stoney's equations may appear as follows:

$$\sigma_{xx} = \frac{E_s \cdot t_s^2}{6 \cdot t_f (1 - v_s^2)} (\Delta\kappa_{xx} + v_s \Delta\kappa_{yy})$$

$$\sigma_{yy} = \frac{E_s \cdot t_s^2}{6 \cdot t_f (1 - v_s^2)} (\Delta\kappa_{yy} + v_s \Delta\kappa_{xx})$$

$$\sigma_{xy} = \frac{E_s \cdot t_s^2}{12 \cdot t_f (1 + v_s)} (\Delta\kappa_{xy})$$

where $\sigma_{xx}$ is the stress in the x direction;

$\sigma_{yy}$ is the stress in the y direction;

$\sigma_{xy}$ is the shear stress in the x-y plane;

$E_s$ is a Young's Modulus of a substrate of the wafer;

$v_s$ is a Poisson ratio of the wafer substrate;

$t_s$ is a thickness of the wafer substrate;

$t_f$ is a thickness of the current top layer;

$\Delta\kappa_{xx}$ is the change in wafer curvature in the x direction;

$\Delta\kappa_{yy}$ is the change in wafer curvature in the y direction; and $\Delta\kappa_{xy}$ is the change in wafer curvature in the x-y plane.

A wafer curvature metrology tool may output these stress calculations already. Alternatively, a wafer curvature metrology tool may output the change in wafer curvature data, which may be used to calculate the stresses using the modified Stoney's equations provided above.

After calculating the stresses ($\sigma_{xx}$, $\sigma_{yy}$, and $\sigma_{xy}$) the stress gradient vector may be calculated for each finite element area on the wafer (or at least those areas of interest, if not all). The following stress gradient vector equation may be used to provide the calculations:

$$\nabla \sigma = \left( \frac{\partial \sigma_{xx}}{\partial x} + \frac{\partial \sigma_{xy}}{\partial y} \right) \vec{e}_i + \left( \frac{\partial \sigma_{xy}}{\partial x} + \frac{\partial \sigma_{yy}}{\partial y} \right) \vec{e}_j$$

where $\nabla \sigma$ is the stress gradient vector for each area of the set of finite areas;

$\vec{e}_i$ is a unit vector in the x direction; and $\vec{e}_j$ is a unit vector in the y direction.

After calculating the stress gradient vectors for each finite element are of interest on the wafer, this stress gradient vector data may be used to calculate a norm of each stress gradient vector. The following equation may be used to calculate the norm for each stress gradient vector:

$$|\nabla \sigma| = \sqrt{\left( \frac{\partial \sigma_{xx}}{\partial x} + \frac{\partial \sigma_{xy}}{\partial y} \right)^2 + \left( \frac{\partial \sigma_{xy}}{\partial x} + \frac{\partial \sigma_{yy}}{\partial y} \right)^2}$$

Essentially, the norm provides an absolute value for the stress gradient vector. This is done to simplify the plotting of the data and/or to simplify the comparison of the data to a specification tolerance (e.g., for automated logic decisions). The aforementioned equation value may be obtained by a fundamental numerical difference scheme (e.g., central difference, forward difference, or backward difference), for example.

Figure 1:
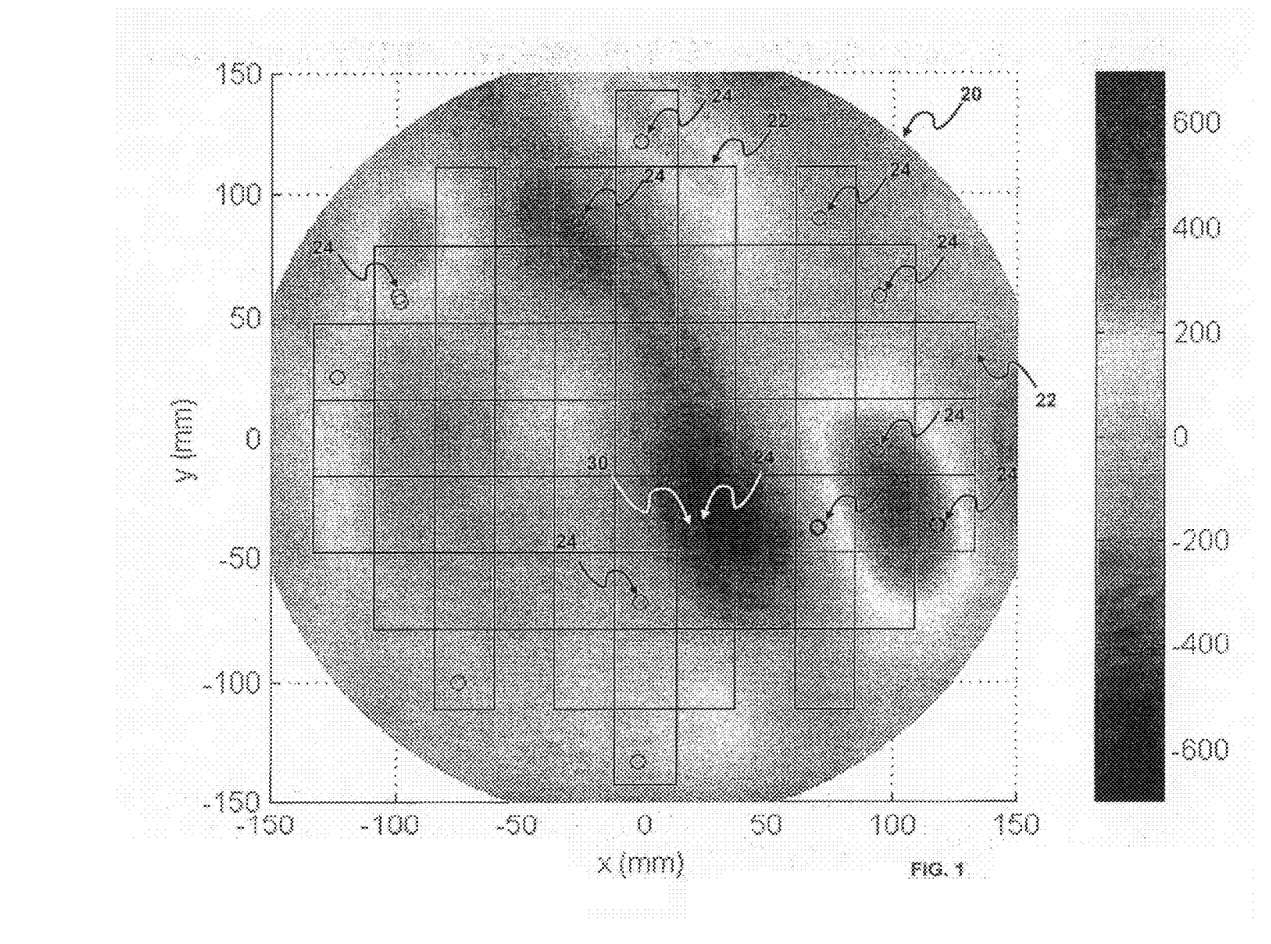
FIG. 1 shows a scaled stress map for stress in the x direction for the finite area elements of a wafer.
Figure 2:
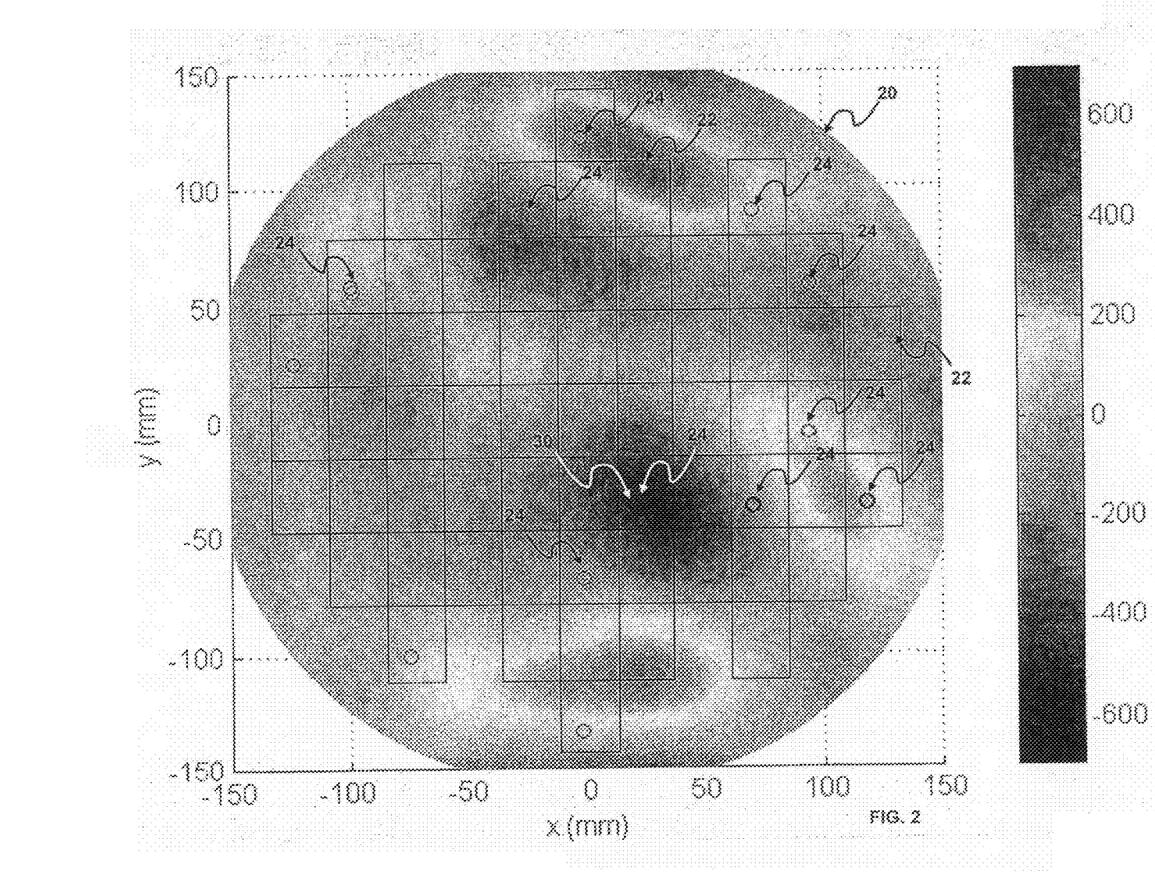
FIG. 2 shows a scaled stress map for stress in the y direction for the finite area elements of the wafer of FIG. 1.
Figure 3:
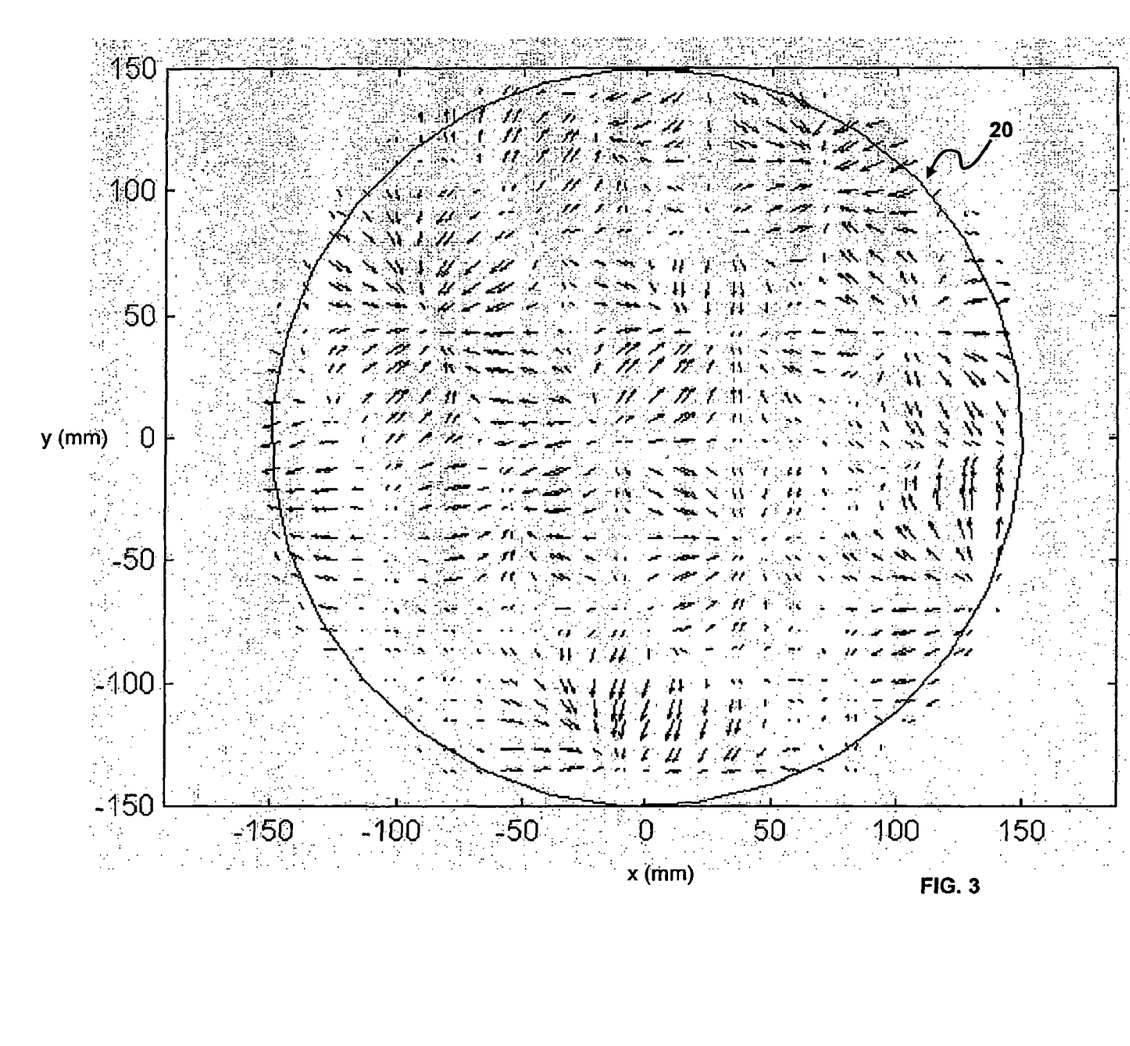
FIG. 3 shows a scaled stress gradient vector map for the stress gradient vectors ($\Delta\sigma$) of the finite area elements of the wafer of FIGS. 1 and 2.
Figure 4:
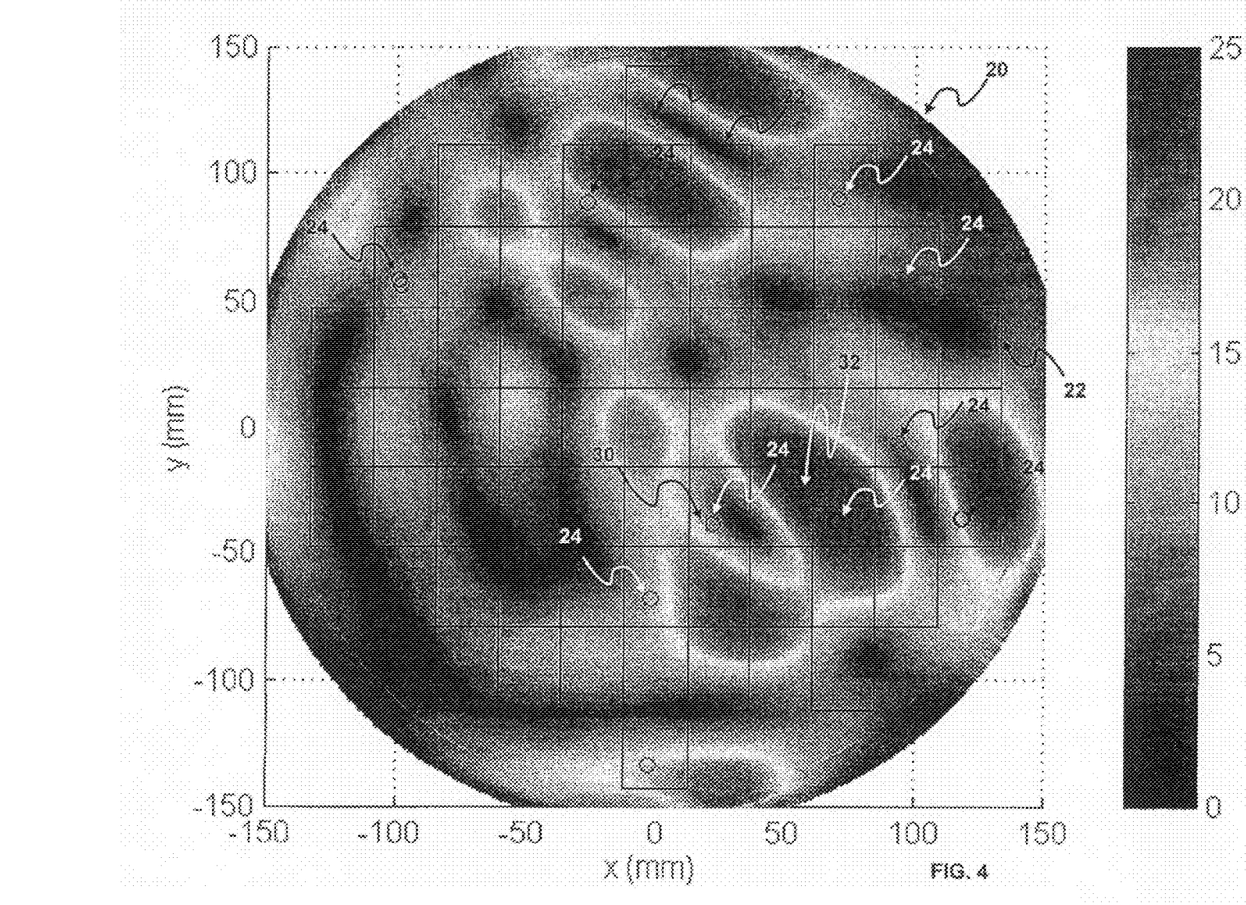
FIG. 4 shows a scaled stress gradient norm map for the stress gradient vector norms ($|\Delta\sigma|$) of the finite area elements of the wafer of FIGS. 1-3.

With the data calculated (e.g., as described above), the data may be plotted to visualize areas having a higher stress gradient. Stress imbalances and acute stress differentials have been found to be causes of defects in integrated circuits. FIGS. 1-4 show some illustrative mappings for some example data from a silicon nitride layer deposited using chemical vapor deposition (CVD), for example. FIG. 1 shows a scaled stress map for stress in the x direction for the finite area elements of the wafer 20. Similarly, FIG. 2 shows a scaled stress map for stress in the y direction for the finite area elements of the wafer 20. FIG. 3 shows a scaled stress gradient vector map for the stress gradient vectors ($\nabla \sigma$) of the finite area elements of the wafer 20. FIG. 4 shows a scaled stress gradient norm map for the stress gradient vector norms ($|\nabla \sigma|$) of the finite area elements of the wafer 20. The maps shown in FIGS. 1-4 are based on the same stress and change in curvature data. In FIGS. 1, 2, and 4, each chip area boundary line 22 is shown and the mapping has been simplified as a line drawing with different shading areas (for purposes of illustration in accordance with the patent rules). In an actual mapping for an embodiment, the mapping is preferably color coded for ease of reading and to disclose more details regarding the gradients. Chips areas with an actual defect are labeled with dots 24 in FIGS. 1, 2, and 4. Note in FIG. 4 that a defect 30 of the group of defects 24 is located at a relatively high stress gradient region.

The norm for the stress gradient vector may be used to identify a high stress gradient area of the current top layer (film) or a combination of currently upper layers, for example. A high stress gradient vector may be determined relative to other areas on the wafer 20 or relative to a threshold level of the specification. This threshold level may be determined by experimentation (e.g., using the same method of testing to test the same layer(s) for a set of wafers in a research and/or troubleshooting setting). This testing method may be used in research and development to determine which film makeup or process of making the film has a better thermal budget and/or better reliability, for example. Also, this testing method may be used to troubleshoot and identify which step or process is causing failures in a set of steps of a manufacturing process (e.g., by testing after each step to compare stress gradient results between steps).

Electron beam scan, wafer acceptance test, or yield data may be used to provide the location of defects (dots) 24 during research and development, or to verify defects in high stress gradient areas, for example. In one embodiment of implementing the testing method of the present invention, Matlab™, or some other suitable software program using any other suitable programming language, may be used to map the stress gradient vector data (e.g., like any of FIGS. 1-4) along with the chip area boundaries 22 and coordinates of the defects 24. This may be useful in a research and/or troubleshooting scenario.

Figure 5A:
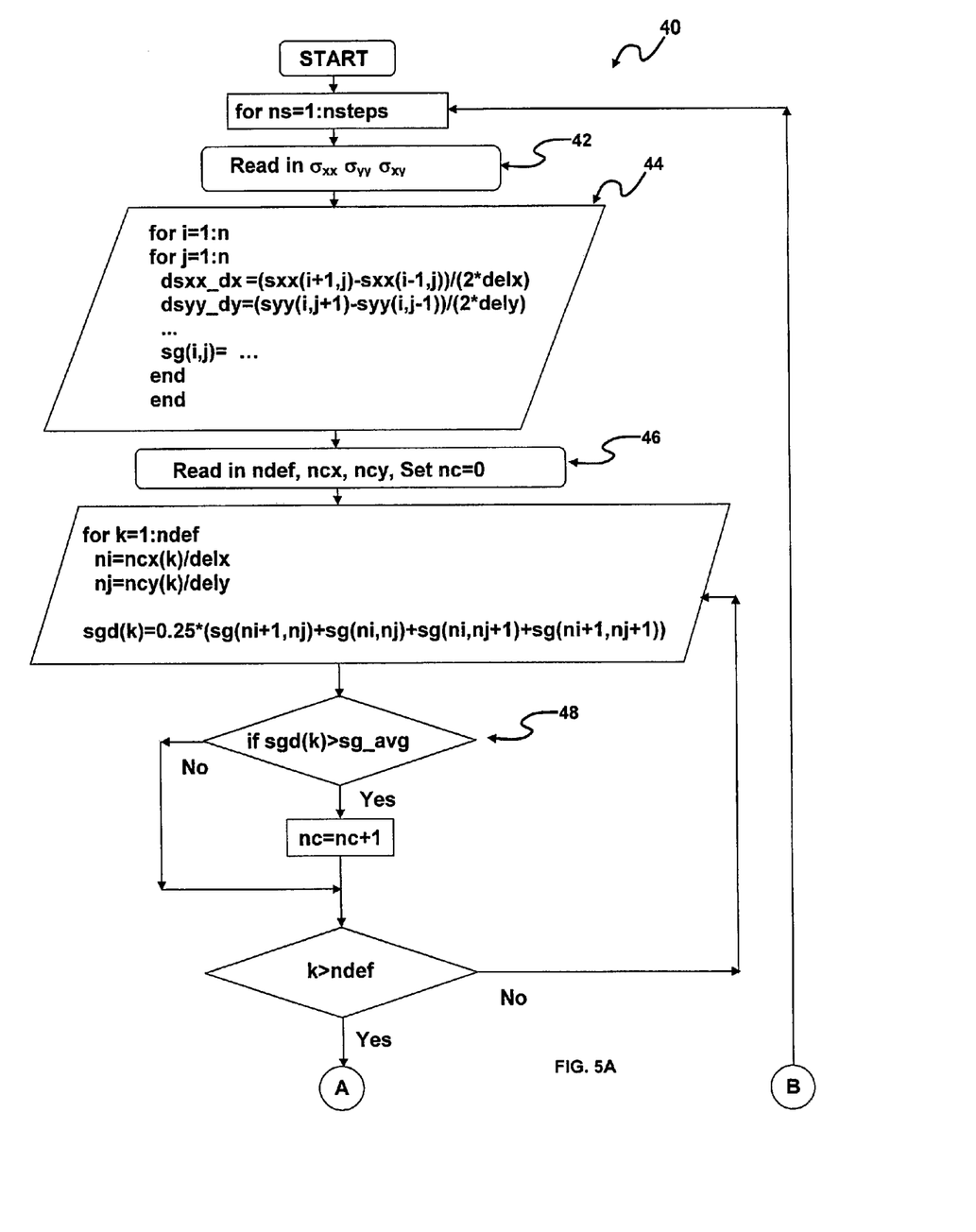
FIGS. 5A and 5B show a flow chart for a software algorithm that may be used to provide the plot shown in FIG. 4, and FIGS. 5C and 5D show flow charts for illustrative embodiments.
Figure 5B:
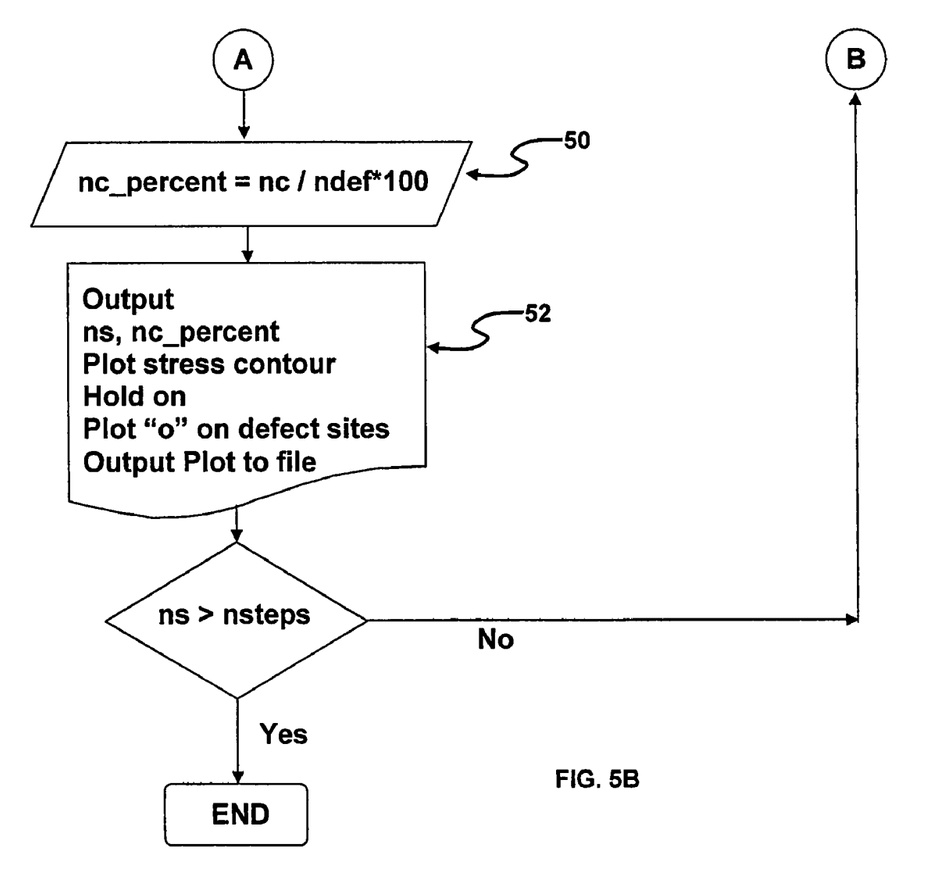

FIGS. 5A and 5B show a flow chart for a software algorithm (designed for use in Matlab) that may be used to provide the plot shown in FIG. 4. At step 42 in FIG. 5A, the stress values are input from the wafer curvature metrology tool. The stress data ($\sigma_{xx}$, $\sigma_{yy}$, and $\sigma_{xy}$) for the finite area elements is used to calculate the stress gradient vectors (see, e.g., sg(i,j) in FIG. 5A) at computation block 44 in FIG. 5A. The flowchart then continues with logic to compare the location of defects (ncx and ncy at block 46 being defect coordinates on the x-y plane) with locations that have a high stress gradient vector norm (high being greater than the average stress gradient vector norm in this example). The stress gradient vector norm is compared to the average to determine if it is greater than the average value for that wafer (see decision block 48 in FIG. 5A) (or for some set of wafers for a moving average). Optionally, percentage of matches for chips with defects and chips having a stress gradient vector norm greater than the average may be calculated to evaluate the correlation (see blocks 50 and 52 in FIG. 5B). This mapping of the defects with the stress gradient vector norm data in FIG. 4 provides a verification that the defect 30 occurred at the high stress gradient region. Correlating the defect sites 24 with the region(s) having the relatively higher stress gradient vector norms (e.g., higher than the wafer average), may be used to set the threshold level to filter future investigated wafers. If the stress gradient vector norm is greater than the average value or moving average, than the defect location is incremented (as shown by the block labeled nc=nc+1), and processing continues. Otherwise, the defect location is not incremented, and processing continues. At a next decision point (labeled k>ndef) the $k^{th}$ data point is compared to determine if it exceeds a predetermined threshold ndef. If so, processing continues to operation 50 (see FIG. 5B). Otherwise a next stress gradient vector norm is determined. At operation 50, a value nc-percent, which is the percentage of defects relative a predetermined threshold, is determined. This value is then outputted, e.g. to a stress contour plot. The value ns is then compared to a predetermined value nsteps, as indicated by decision point labeled ns>nsteps. If the value ns exceeds threshold nsteps, this indicates analysis is complete, and (this portion of) processing terminates. Otherwise the flow chart illustrated in FIGS. 5A and 5B continues for the next ns value, and the next set of stress coordinants.

Figure 5C:
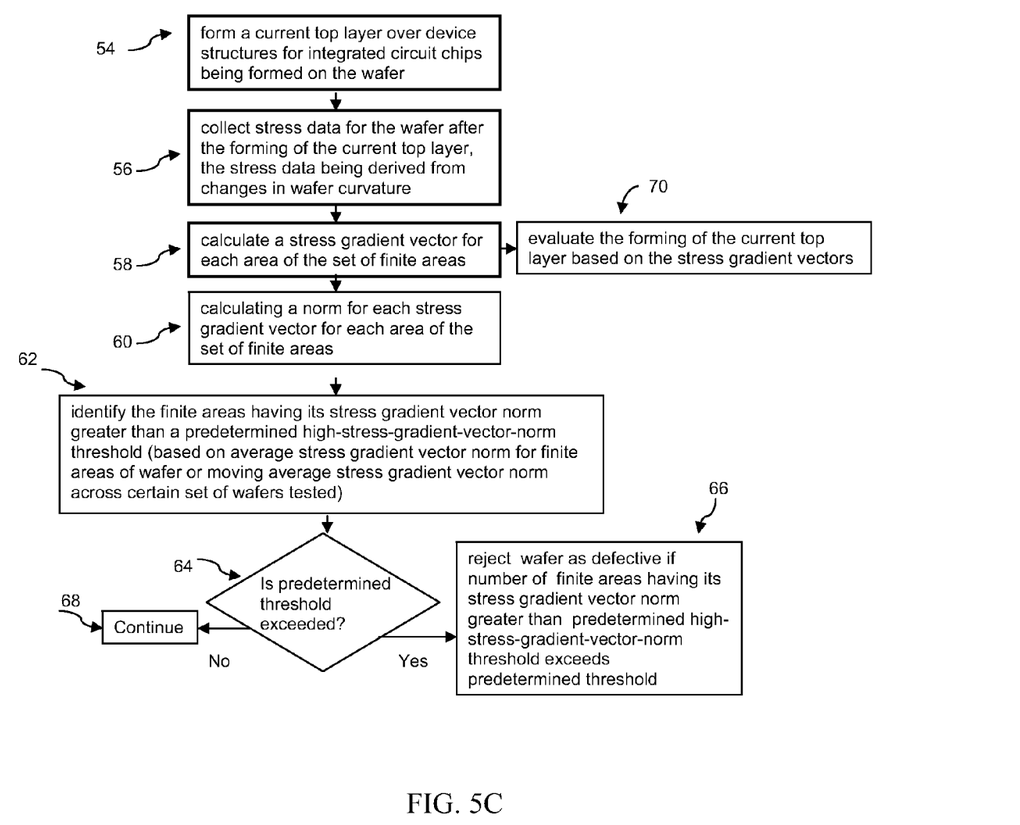

FIG. 5C illustrates another embodiment. In step 54, a current top layer is formed over device structures for integrated circuit chips formed on a wafer. In step 56, stress data is collected for the wafer after the forming of the current top layer, and the stress data is derived from changes in the wafer curvature. In step 58, a stress gradient vector for each area of the set of finite areas is calculated. In step 70, the forming of the current top layer is evaluated based on the stress gradient vectors. In step 60, a norm for each stress gradient vector for each area of the set of finite areas is calculated. In step 62, the finite areas having its stress gradient vector norm greater than a predetermined high-stress-gradient-vector-norm threshold (based on average stress gradient vector norm for finite areas of wafer or moving average stress gradient vector norm across certain set of wafers tested) is identified. In step 64, determine whether a predetermined threshold is exceeded. In step 66, if the predetermined threshold is exceeded, the wafer is rejected as defective. In step 68, if the predetermined threshold is not exceeded, the process continues.

Figure 5D:
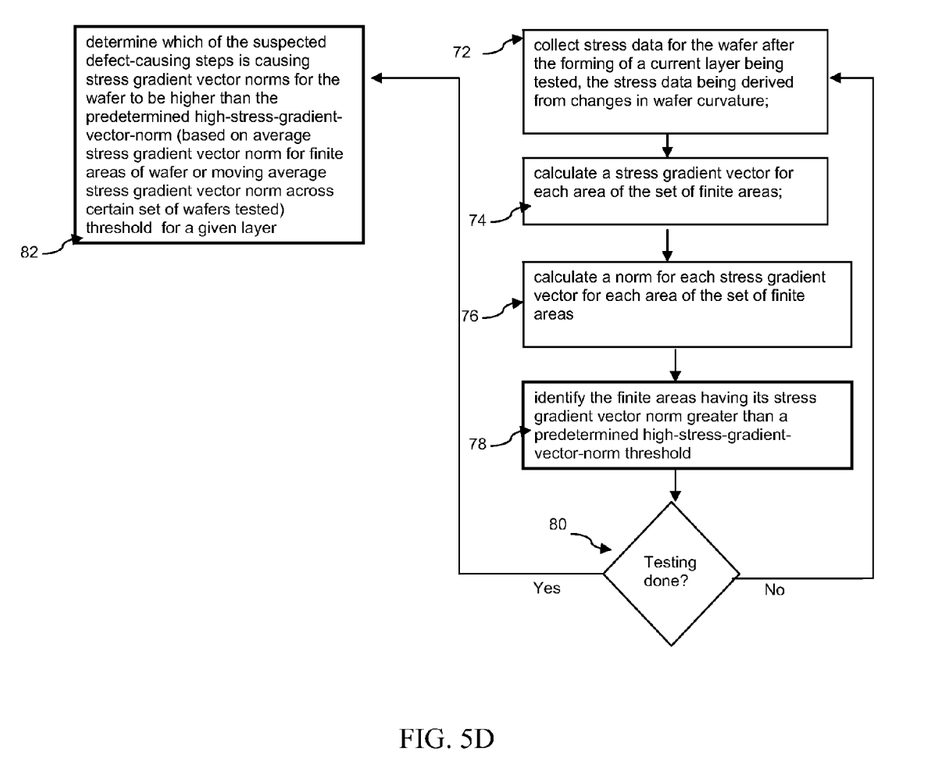

FIG. 5D illustrates a further embodiment. In step 72, stress data for the wafer after forming the current layer being tested is collected, and the stress data is derived from changes in the wafer curvature. In step 74, a stress gradient vector for each area of the set of finite areas is calculated. In step 76, a norm for each stress gradient vector for each area of the set of finite areas is calculated. In step 78, the finite areas having its stress gradient vector norm greater than a predetermined high-stress-gradient-vector-norm threshold is identified. In step 80, determine whether testing is complete. If testing is not complete, the process continues to step 72. If testing is complete, in step 82, determine which of the suspected defect-causing steps is causing stress gradient vector norms for the wafer to be higher than the predetermined high-stress-gradient-vector-norm threshold for a given layer.

In applying a testing method of the present invention to identify defective regions or regions where a defect is highly likely to occur if production continues, there are several useful applications. As mentioned above, a testing method of the present invention may be used to evaluate a layer material, layer thickness, a layer formation process, a layer's reaction to a thermal process, and combinations thereof, during research and development. A testing method of the present invention may be used to determine what process and material provide the best results for use in manufacturing (e.g., better thermal budget, better reliability in formation). Also through testing a certain process of forming a layer, a tolerance for a high stress gradient vector norm value may be ascertained from the research. Thus during manufacturing, a testing method of the present invention may be automated to evaluate a certain layer as desired during manufacturing.

For example, with a threshold value determined for a high stress gradient vector norm, a certain layer may be tested at any desirable or statistically feasible interval during manufacturing. If too many regions have a stress gradient vector norm greater than the threshold value, the manufacturing may be discontinued on that wafer, or the wafer may be reprocessed for that layer (if feasible) to at least partially remove the defective layer and reform the layer again. Or, the wafer may be recycled (e.g., stripped down to some certain level to reuse the wafer from that stripped down state). In any case, further manufacturing on a wafer with a defective layer may be halted to save the expense and time of further processing on that defective wafer.

In another application of a testing method of the present invention, the threshold value for the high stress gradient vector norm may be a moving average, may be a static average, or may be determined using any other suitable statistical method of setting the threshold value. In troubleshooting, the testing method may be employed on certain occasions where it is unknown which step is causing repeated defects in a region or repeated yields below acceptable levels. The testing method may be inserted between possibly any step in the manufacturing process to help pinpoint the problematic step or process.

If a particular step is known to be unreliable, yet still desirable for current use, a testing method of the present invention may be incorporated into the manufacturing process to test the current upper layer(s) directly after or at any suitable point after the problematic step to evaluate the wafer before proceeding with more processing. The testing method may be fully automated by inputting change in curvature data and/or stress data (e.g., from a wafer curvature metrology tool) into a software program, calculating the stress gradient vector and stress gradient vector norm for the finite areas of interest (or all of them), and then comparing the stress gradient vector norm data to a predetermined high-stress-gradient-norm threshold value (which may be static or dynamic, e.g., moving average). Then, if too many finite area elements are found to be above the threshold value, a logic decision in the software may be used to decide whether to continue manufacturing on that wafer or whether to reject it as defective. With the benefit of this description, one of ordinary skill in the art should be able to see the usefulness and other potential applications of a testing method of the present invention in semiconductor research, troubleshooting, manufacturing, and any combination thereof.

Screening using a testing method of the present invention may be performed by batch runs in a single processor (e.g., automatically) or by distributed computing in multiple processors, for example. After the repeatability of stress gradient vector norms exceeding the threshold are verified against defects for a specific step, the stress gradient vector norm parameter (threshold) and a testing method of the present invention may be implemented into the metrology tool for inspection when the film stress is evaluated. Hence in an embodiment, a testing method of the present invention may be incorporated into and calculated by a metrology tool, for example. The mapping correlation may be performed by an offline analysis and the inline screening may be set after the relation is established (between defects and stress gradient vector norm level). The flowchart, or some variation thereof, may be used to determine and set the relationship between defects and stress gradient vectors.

For an example process having the conditions of forming a SiN_layer before silicide formation using a LPCVD process, a predetermined high-stress-gradient-vector-norm threshold may be __15 MPa/mm, for example. In another example process having the conditions of super anneal on a material layer before silicide formation using a Flash process, a predetermined high-stress-gradient-vector-norm threshold may be 100 MPa/mm. Each case may have a different threshold level, which will typically be determined during research and development.

Several advantages of the testing method for an embodiment of the present invention have been mentioned above. Other advantages that may be realized by use of the testing method for an embodiment of the present invention may include (but are not necessarily limited to):

Wafer film stress uniformity evaluation; and

Upper and lower layer film stress difference effect assessment. (e.g. adhesion or microstructure reliability problem due to stress gradient difference of two layers).

Although embodiments of the present invention and at least some of its advantages have been described in detail, it should be understood that various changes, substitutions, and alterations can be made herein without departing from the spirit and scope of the invention as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of testing a wafer during semiconductor manufacturing, comprising:
    forming a current top layer over device structures for integrated circuit chips being formed on the wafer;
    collecting stress data for the wafer after the forming of the current top layer, the stress data being derived from changes in wafer curvature;
    calculating a stress gradient vector for each area of the set of finite areas;
    calculating a norm for each stress gradient vector for each area of the set of finite areas; and
    identifying the finite areas having its stress gradient vector norm greater than a predetermined high-stress-gradient-vector-norm threshold.

2. The method of claim 1, further comprising rejecting the wafer as defective if a number of the finite areas having its stress gradient vector norm greater than a predetermined high-stress-gradient-vector-norm threshold exceeds a predetermined threshold.

3. The method of claim 1, wherein the predetermined high-stress-gradient-vector-norm threshold is based on an average stress gradient vector norm for the finite areas of the wafer.

4. The method of claim 1, wherein the predetermined high-stress-gradient-vector-norm threshold is based on a moving average stress gradient vector norm across a certain set of wafers tested.

5. The method of claim 1, wherein the stress data comprises:
    stress-xx in an x direction and stress-yy in a y direction for each area of a set of finite areas on the wafer, the stress-xx and stress-yy both being derived from wafer-curvature-change-xx in the x direction for each area of the set of finite areas and from wafer-curvature-change-yy in the y direction for each area of the set of finite areas, wherein an x-y plane is along a top surface of the wafer and wherein the x direction is orthogonal to the y direction; and
    stress-xy being a shear stress in the x-y plane for each area of the set of finite areas, the stress-xy being derived from wafer-curvature-change-xy, wherein wafer-curvature-change-xy is a change in wafer twist in the x-y plane for each area of the set of finite areas.

6. The method of claim 5, wherein the stress data is calculated using the following equations:

$$\sigma_{xx} = \frac{E_s \cdot t_s^2}{6 \cdot t_f (1 - v_s^2)} (\Delta \kappa_{xx} + v_s \Delta \kappa_{yy})$$

$$\sigma_{yy} = \frac{E_s \cdot t_s^2}{6 \cdot t_f (1 - v_s^2)} (\Delta \kappa_{yy} + v_s \Delta \kappa_{xx})$$

$$\sigma_{xy} = \frac{E_s \cdot t_s^2}{12 \cdot t_f (1 + v_s)} (\Delta \kappa_{xy})$$

where
    $\sigma_{xx}$ is the stress-xx in the x direction;
    $\sigma_{yy}$ is the stress-yy in the y direction;
    $\sigma_{xy}$ is the stress-xy in the x-y plane;
    $E_s$ is a Young's Modulus of a substrate of the wafer;
    $v_s$ is a Poisson ratio of the wafer substrate;
    $t_s$ is a thickness of the wafer substrate;
    $t_f$ is a thickness of the accumulated investigating layer (single or multiple layers);
    $\Delta \kappa_{xx}$ is the wafer-curvature-change-xx in the x direction;
    $\Delta \kappa_{yy}$ is the wafer-curvature-change-yy in the y direction; and
    $\Delta \kappa_{xy}$ is the wafer-curvature-change-xy in the x-y plane.

7. The method of claim 6, wherein the calculating of the stress gradient vectors is performed using the following equation:

$$\nabla \sigma = \left( \frac{\partial \sigma_{xx}}{\partial x} + \frac{\partial \sigma_{xy}}{\partial y} \right) \vec{e}_i + \left( \frac{\partial \sigma_{xy}}{\partial x} + \frac{\partial \sigma_{yy}}{\partial y} \right) \vec{e}_j$$

where
    $\nabla \sigma$ is the stress gradient vector for each area of the set of finite areas;
    $\vec{e}_i$ is a unit vector in the x direction; and
    $\vec{e}_j$ is a unit vector in the y direction.

8. The method of claim 7, wherein the calculating of the norm for each stress gradient vector is performed using the following equation:

$$|\nabla \sigma| = \sqrt{\left( \frac{\partial \sigma_{xx}}{\partial x} + \frac{\partial \sigma_{xy}}{\partial y} \right)^2 + \left( \frac{\partial \sigma_{xy}}{\partial x} + \frac{\partial \sigma_{yy}}{\partial y} \right)^2}$$

where
    $|\nabla \sigma|$ is the norm for each stress gradient vector.

9. A method of testing a wafer, comprising:
    forming a current top layer over the wafer;
    collecting stress data for the wafer after the forming of the current top layer, the stress data being derived from changes in wafer curvature;
    calculating a stress gradient vector for each area of the set of finite areas; and
    evaluating the forming of the current top layer based on the stress gradient vectors.

10. The method of claim 9, wherein the stress data comprises:
    stress-xx in an x direction and stress-yy in a y direction for each area of a set of finite areas on the wafer, the stress-xx and stress-yy both being derived from wafer-curvature-change-xx in the x direction for each area of the set of finite areas and from wafer-curvature-change-yy in the y direction for each area of the set of finite areas, wherein an x-y plane is along a top surface of the wafer and wherein the x direction is orthogonal to the y direction; and
    stress-xy being a shear stress in the x-y plane for each area of the set of finite areas, the stress-xy being derived from wafer-curvature-change-xy, wherein wafer-curvature-change-xy is a change in wafer twist in the x-y plane for each area of the set of finite areas.

11. The method of claim 9, further comprising:
    calculating a norm for each stress gradient vector for each area of the set of finite areas; and evaluating the forming of the current top layer based on stress gradient vector norms.

12. The method of claim 11, further comprising determining a high-stress-gradient-vector-norm threshold for use in testing during manufacturing based on the stress gradient vector norms.

13. The method of claim 11, wherein the predetermined high-stress-gradient-vector-norm threshold is based on an average stress gradient vector norm for the finite areas of the wafer.

14. The method of claim 11, wherein the predetermined high-stress-gradient-vector-norm threshold is based on a moving average stress gradient vector norm across a certain set of wafers tested.

15. A method of troubleshooting to find a cause of defects in semiconductor manufacturing, comprising:
testing a wafer after various suspected defect-causing steps in a semiconductor manufacturing process, each testing comprising:
collecting stress data for the wafer after the forming of a current layer being tested, the stress data being derived from changes in wafer curvature;
calculating a stress gradient vector for each area of the set of finite areas;
calculating a norm for each stress gradient vector for each area of the set of finite areas; and
identifying the finite areas having its stress gradient vector norm greater than a predetermined high-stress-gradient-vector-norm threshold; and
determining which of the suspected defect-causing steps is causing stress gradient vector norms for the wafer to be higher than the predetermined high-stress-gradient-vector-norm threshold for a given layer.

16. The method of claim 15, wherein the stress data comprises:
stress-xx in an x direction and stress-yy in a y direction for each area of a set of finite areas on the wafer, the stress-xx and stress-yy both being derived from wafer-curvature-change-xx in the x direction for each area of the set of finite areas and from wafer-curvature-change-yy in the y direction for each area of the set of finite areas, wherein an x-y plane is along a top surface of the wafer and wherein the x direction is orthogonal to the y direction; and
stress-xy being a shear stress in the x-y plane for each area of the set of finite areas, the stress-xy being derived from wafer-curvature-change-xy, wherein wafer-curvature-change-xy is a change in wafer twist in the x-y plane for each area of the set of finite areas.

17. The method of claim 15, wherein the predetermined high-stress-gradient-vector-norm threshold is based on an average stress gradient vector norm for the finite areas of the wafer.

18. The method of claim 15, wherein the predetermined high-stress-gradient-vector-norm threshold is based on a moving average stress gradient vector norm across a certain set of wafers tested.

* * * * *